(12) United States Patent
Laroche et al.

(10) Patent No.: US 6,566,163 B1
(45) Date of Patent: May 20, 2003

(54) METHOD FOR MAKING A CONTACTLESS CARD WITH ANTENNA CONNECTED WITH SOLDERED WIRES

(75) Inventors: Damien Laroche, Chateauneuf le Rouge (FR); Pierre Garnier, La Seyne sur Mer (FR)

(73) Assignee: Gemplus (FR)

( * ) Notice: Subject to any disclaimer, the term of this patent is extended or adjusted under 35 U.S.C. 154(b) by 0 days.

(21) Appl. No.: 09/381,803

(22) PCT Filed: Feb. 27, 1998

(86) PCT No.: PCT/FR98/00383

§ 371 (c)(1),
(2), (4) Date: Dec. 6, 1999

(87) PCT Pub. No.: WO98/43205

PCT Pub. Date: Oct. 1, 1998

(30) Foreign Application Priority Data

Mar. 25, 1997 (FR) .............................. 97 03630

(51) Int. Cl.[7] .................. H01L 21/44; H01L 21/48; H01L 21/50; H01L 21/301; H01L 21/46
(52) U.S. Cl. .................. 438/106; 438/109; 438/462
(58) Field of Search ................. 438/106, 109, 438/462; 257/679

(56) References Cited

U.S. PATENT DOCUMENTS 5,710,458 A * 1/1998 Iwasaki
6,049,463 A * 4/2000 O'Molley et al.

FOREIGN PATENT DOCUMENTS

| FR | 2584862 A | 1/1987 |
|---|---|---|
| WO | WO9318493 A | 9/1993 |
| WO | WO9607985 A | 3/1996 |

* cited by examiner

Primary Examiner—David E. Graybill
(74) Attorney, Agent, or Firm—Burns, Doane, Swecker & Mathis, L.L.P.

(57) ABSTRACT

The invention concerns a method of making contactless smart cards. To facilitate the fixing of an integrated circuit chip in a contactless smart card, and in particular the chip connection with the antenna incorporated in the card, the method consists in soldering on the chip contact pads a gold wire with at least one end projecting above the chip. The wire is preferably soldered while the chip is still part of a semiconductor wafer. The wire can be soldered between two contact pads on a common chip; it can also be soldered between two contact pads of two adjacent chips on the wafer and then sawed during dicing. When the chip is incorporated in the card, it is pressed against the antenna so that the soldered wire is in contact with the coiled or printed antenna feeder end.

10 Claims, 2 Drawing Sheets

METHOD FOR MAKING A CONTACTLESS CARD WITH ANTENNA CONNECTED WITH SOLDERED WIRES

This disclosure is based upon, and claims priority from, French Patent Application No. 97/03630, filed Mar. 25, 1997, and International Application No. PCT/FR98/00383, filed Feb. 27, 1998, the contents of which are incorporated herein by reference.

FIELD OF THE INVENTION

The present invention concerns the making of smart cards, and more particularly smart cards which are capable of contactless operation by means of an antenna integrated in the card.

BACKGROUND OF THE INVENTION

Smart cards are intended to carry out various operations, such as, for example, banking operations, telephone communications, identification operations, operations of debiting or recharging account units, and all sorts of operations which can be performed remotely by high-frequency electromagnetic coupling between a transmitting/receiving terminal and a card placed in the operational area of this terminal.

One of the main technical problems that is necessary to solve in the making of such cards is the connection of the antenna with the integrated circuit chip which provides the electronic functioning of the card. The conventional constraints of mechanical strength, reliability and manufacturing cost must obviously be taken into account in the manufacturing operations.

The object of the invention is to provide a manufacturing method which makes it possible to best solve the problem of the electrical connection between the chip and the antenna.

SUMMARY OF THE INVENTION

To this end, the invention proposes to make, in a first phase, an integrated circuit chip provided with at least one portion of conductive wire soldered on the chip, this wire having a part projecting with respect to the surface of the chip, and then, in a second phase, to place the chip and an antenna conductor in electrical contact, by applying the projecting part on to one end of the antenna conductor so as to establish a direct electrical contact between the antenna and the soldered wire.

In other words, use is made of the highly conventional technique of wire bonding, or soldering a wire by thermocompression, i.e., soldering a wire (in general of gold or aluminium) on a chip, but instead of using this technique in the usual way, by making a wire come from a contact pad of the chip in order to bring it to a contact pad of a chip support element (usually a connection grid or a printed circuit module), one end of the wire is soldered on a contact pad of the chip but the other end is not soldered on an external element on to which the chip would be transferred. The wire remains free in order to serve as a contact element projecting above the chip.

The invention consequently proposes a method for making a contactless smart card, having an integrated circuit chip and an antenna, characterised in that, in a preliminary step, at least one conductive wire is soldered on a contact pad of the chip without furthermore soldering it on a chip support element, and, in a subsequent step, a direct electrical contact is established between the soldered wire and one end of an antenna conductor.

Various implementations of this method can be envisaged. In a first embodiment, the first end of the soldered wire is soldered on a contact pad of the chip and the second remains free, so that the inherent elasticity of the wire facilitates the wire and the antenna being brought into contact. In another embodiment, the wire is soldered on two contact pads of the chip, and the part of the wire situated between these two pads projects above the chip. Here again, the elasticity of the wire facilitates contact with the antenna conductor. In a third embodiment, the wire is cut off very short above the chip, so that there remains in practice only a flattened metal ball on the contact pad (that is to say the ball conventionally formed by the soldering head of the thermocompression soldering apparatus), but this ball projects sufficiently to allow a contact with the antenna conductor.

The operation of soldering the conductive wire is performed preferably while the chip is still part of a wafer which will subsequently be diced (whereas the conventional wire bonding technique for connecting with an external support is always used on a chip already cut from the wafer and ready to be mounted in a package).

BRIEF DESCRIPTION OF THE DRAWINGS

Other characteristics and advantages of the invention will emerge from a reading of the detailed description which follows and which is produced with reference to the accompanying drawings in which.

DETAILED DESCRIPTION

Figure 1:
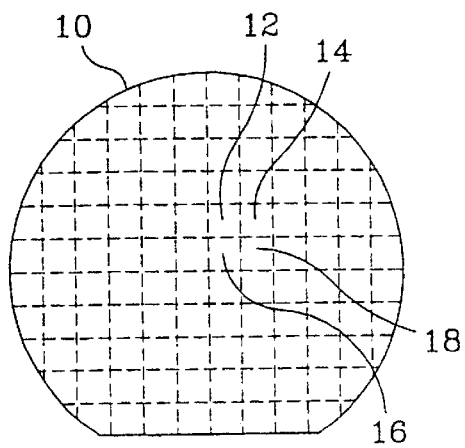
FIG. 1 depicts a top view of a semiconductor wafer on which a multiplicity of electrical circuits intended for a smart card have been integrated.

FIG. 1 depicts a semiconductor wafer 10 on which integrated circuits intended to be subsequently separated into individual chips have been embodied conventionally. The cutting areas to allow dicing are depicted by dashed lines.

Figure 2:
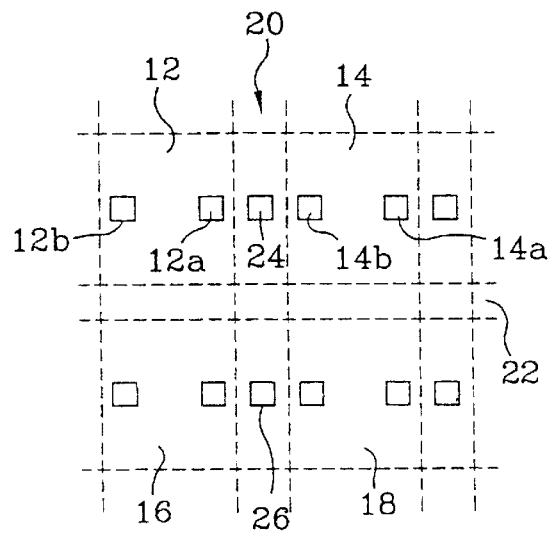
FIG. 2 depicts, in a magnified top view, the juxtaposed chips on the wafer, with two contact pads per chip.

FIG. 2 depicts a magnified view with a few juxtaposed chips 12, 14, 16, 18, separated by a vertical cutting path 20 and a horizontal cutting path 22.

On each chip, two contact pads have been provided, to allow the soldering of a gold or aluminium wire according to the conventional wire bonding technique. The contact pads are designated by the index a and b for each chip, that is to say, the chip 12 has two pads 12a and 12b. An intermediate contact pad has preferably also been provided, placed in a cutting path between two adjacent chips, this pad being situated between two immediately opposite pads each belonging to one of the two adjacent chips. Thus, the intermediate pad 24 is placed between the pads 12a and 14b of the chips 12 and 14, and the intermediate pad 26 is placed between the pads 16a and 18b of the chips 16 and 18. These pads are not mandatory but greatly facilitate the subsequent dicing.

Figure 3:
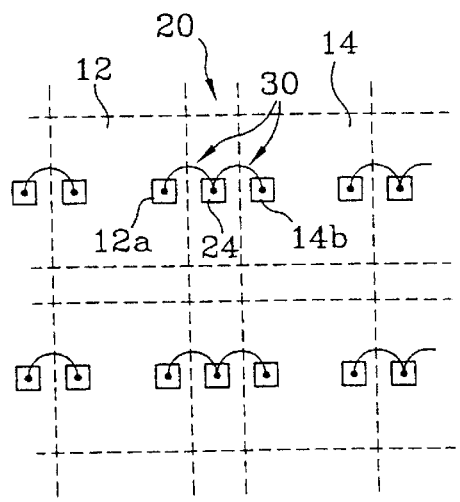
FIG. 3 depicts, in a top view, the chips on the wafer, with gold wires which connect the contact pads of two adjacent chips by means of a contact pad in the cutting path.

FIG. 3 depicts the installation of soldered wires according to the wire bonding technique. The wires are generally gold wires but can also be made of aluminium. A wire 30 is soldered on a pad (for example 12a) of a chip and emerges towards the adjacent intermediate pad 24 which serves as a relay for holding it in place; it is soldered on this intermediate pad 24 and emerges again towards the pad 14b of the adjacent chip 14.

It should be noted that the conventional wire soldering technique, referred to as wire bonding, and used for more than 90% of the integrated circuits produced in the world, consists in applying, by means of a soldering head, the end, in ball form, of a gold or aluminium wire against a pad of the chip, exerting a pressure in the presence of heat (thermocompression soldering), and possibly in the presence of ultrasound; then drawing the wire without cutting it, by means of the soldering head, towards another soldering point which is in general, in the known art, a pad of an element for supporting the chip (a grid or printed circuit); then soldering the wire on this second contact pad; and finally in cutting off the wire immediately after this second soldering operation, leaving a ball of melted metal at the end of the wire with a view to a new soldering operation.

In the present invention, the soldering operation consists in soldering the wire on a pad of one chip, drawing the wire towards the intermediate pad, soldering the wire on this pad, and proceeding again towards a pad of an adjacent chip for a new soldering operation before cutting off the wire. The total wire soldering operation is therefore performed on a semiconductor wafer before cutting it into individual chips.

Figure 4:
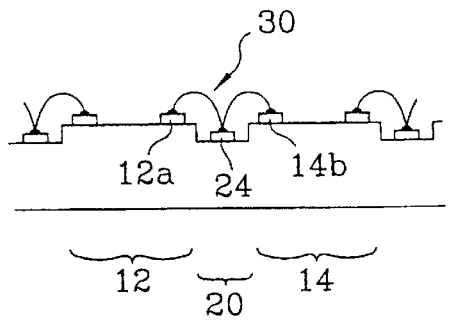
FIG. 4 depicts a lateral section corresponding to FIG. 3.

FIG. 4 depicts in section the mounting of the wires. The cutting path 20 can be hollowed out with respect to the upper surface of the chips in view of the deposition and etching operations which have been carried out on the wafer prior to the wire soldering operations.

Figure 5:
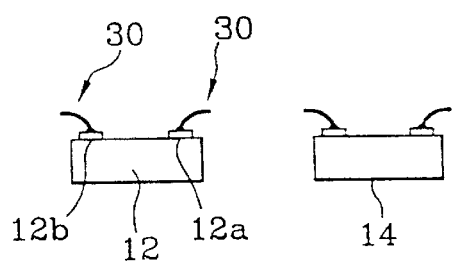
FIG. 5 depicts the cut chips with soldered wires projecting and having one end free.

The next operation is the dicing of the wafer. This dicing is carried out as a rule by sawing, and the soldered wires are cut during this operation. The width of the sawing line is that of the dicing path 20. The intermediate pads 24, 26, situated in this path, disappear during sawing, but they are important in that they hold the wires in place during the chip sawing operation. The sawing of the wires is facilitated thereby. FIG. 5 depicts, in lateral section, the chips resulting from this sawing: the wires 30 have been cut and their ends remain free.

The chips can then be mounted in a contactless card having an antenna. The antenna can be constituted either by a coiled conductive wire or by a conductor printed on an isolating board or sheet.

Figure 6:
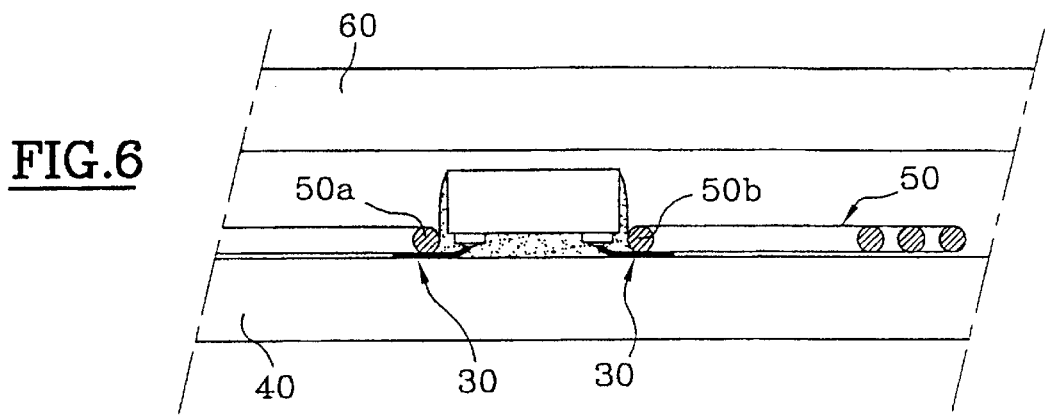
FIG. 6 depicts the mounting of a chip in a card with a connection to a coiled antenna.

In the first case, depicted in FIG. 6, the following procedure can be carried out: the chip 12 with its gold wires 30 is glued against the surface of a sheet or a board of plastic material 40 in the format of the card to be made. The glue is a non-conductive glue. It is the active, front face of the chip, that is to say the one which carries the contact pads and the gold wires, which is applied against this surface. The ends of the soldered wires 30 overhang the edges of the chip owing to their elasticity.

Then the coiled wire antenna 50 is put in place and glued on the plastic sheet 40 so that the ends 50a, 50b of the coiled antenna are applied against the soldered wires 30 and establish a direct electrical contact between the coiled antenna wire (which can be made of copper) and the soldered wires. The contact can then be held in place either by gluing with a drop of conductive glue or by tin soldering between the gold wire and the copper wire.

A second plastic sheet 60 can then be applied on top of the assembly thus implemented and fixed by gluing or by hot or cold lamination, in order to enclose the chip and the antenna and thus form the contactless card.

Figure 7:
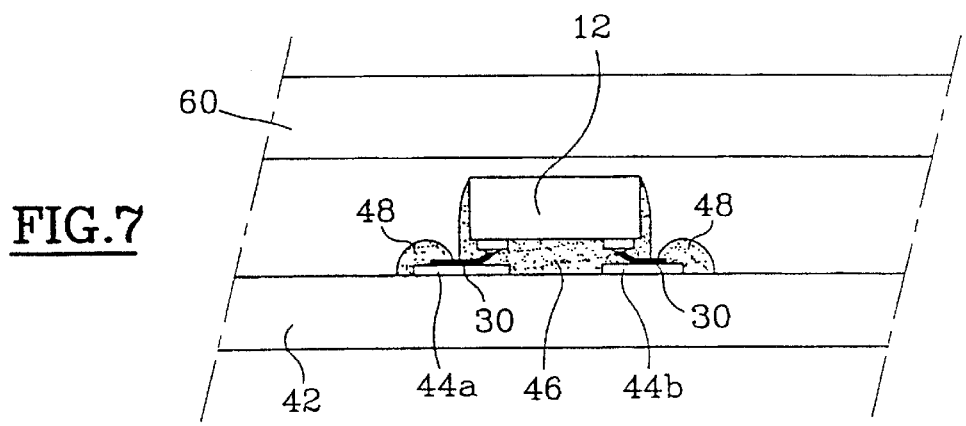
FIG. 7 depicts the mounting of a chip with a printed antenna.

If the antenna is embodied in the form of a printed conductor on an isolating substrate, the mounting is performed as depicted in FIG. 7: the isolating substrate is for example a sheet of plastic 42 (PVC notably) coated with a metallic layer silk-screen printed or etched in the form of the antenna. The ends 44a, 44b of the antenna conductor are separated by a distance which corresponds substantially to the distance between the free ends of the soldered wires 30 of the chip. The chip is glued with a non-conductive glue 46, front face towards the metallized face of the sheet 42, so that the wires soldered on the chip are applied against the ends of the antenna conductor; the non-conductive glue must not be applied so as to prevent electrical contact being made between soldered wires and antenna. A conductive glue 48 can then be applied on the soldered wires in order to hold the electrical contact in place. A second plastic sheet 60 is then added by gluing or hot or cold lamination in order to enclose the chip and form the contactless card.

In the embodiments of FIGS. 6 and 7, the wafer of the chip is preferably coated with non-conductive glue or with another isolating coating (varnish or some other) so that the conductive glue does not establish undesirable contacts between the antenna wire and the chip.

Generally, in all the embodiments described, the use of anisotropic conduction glues instead of the conductive and non-conductive glues can be envisaged, the anisotropic conduction glues having the characteristic of conducting in the direction of the thickness of the layer of glue but not in the direction of the plane of the layer. In this case, an anisotropic conduction glue can replace both the conductive glue and the non-conductive glue, in order to make it possible to carry out the gluing in a single step rather than two without risking undesirable short circuits.

Figure 8:
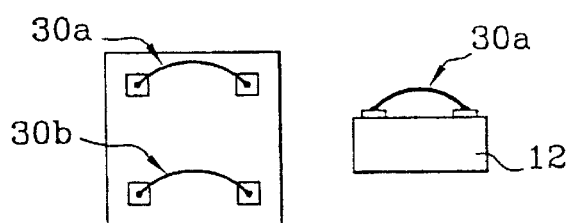
FIG. 8 depicts a variant embodiment in which each wire is soldered on the chip at two points.

In a variant embodiment depicted in FIG. 8 in face view and lateral view, the wires which are soldered on the chip and which are going to be used to establish the contact do not have a cut free end: the two ends of each wire are soldered on two separate contact pads on the chip, and it is the projecting part of the wire between the two ends which is going to establish the contact. At the time the chips are sawed, the wires are not situated in the dicing path and therefore are not cut. It is not necessary to provide intermediate contact pads in the dicing paths. It is moreover possible in this case to solder the gold or aluminium wires before or after the semiconductor wafer is sawed into individual chips.

This embodiment of FIG. 8 lends itself better to a connection with a printed antenna than to a connection with a coiled wire antenna. The method for fixing between the antenna and the chip is preferably tin soldering rather than gluing with a conductive glue which would pose more problems of risks of undesirable contacts. An anisotropic glue is also well adapted to this case.

In the various embodiments described above, provision can advantageously be made that a drop of resin for protection and holding in place is deposited on the front face of the chip. This resin allows in particular the soldered wires to be held in place better in the subsequent sawing and mounting operations. The drop is therefore preferably deposited on each chip before the wafer is sawed.

In another variant embodiment, no intermediate contact pad is used in the dicing path between the chips. The gold wire is relatively taut between a pad of one chip and the pad opposite on the adjacent chip. Given that the operation of soldering a wire on a contact pad creates a ball of solder on the pad and a weakened area of wire just above the ball, the operation of sawing the chips breaks the wire just above the ball which remains alone on the pad.

Figure 9:
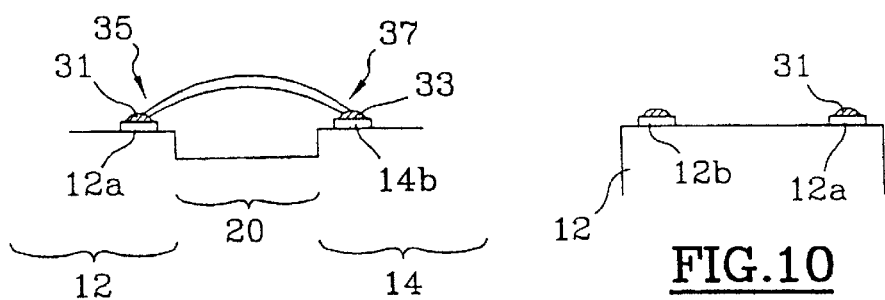
FIGS. 9 and 10 depicts another variant method in which the soldered wires are cut off level with ball formed by the wire soldering apparatus.

FIG. 9 depicts, in an even more magnified transverse view, the wire 30 which connects the pad 12a of one chip 12 and the pad 14b of an adjacent chip 14, above the dicing path. The soldered wire forms a ball 31, 33 on each contact pad, and a weakened area 35, 37 just above the ball.

Figure 10:

FIG. 10 depicts the chips 12 and 14 after sawing, having wires soldered by wire bonding, constituted only by gold or aluminium balls such as 31. The chip is glued on the ends of the antenna conductor, preferably with an anisotropic conduction glue.

It will be appreciated by those of ordinary skill in the art that the present invention can be embodied in other specific forms without departing from the spirit or essential characteristics thereof. The presently disclosed embodiments are therefore considered in all respects to be illustrative, and not restrictive. The scope of the invention is indicated by the appended claims, rather than the foregoing description, and all changes that come within the meaning and range of equivalents thereof are intended to be embraced therein.

What is claimed is:

1. A method for making a contactless smart card, having an integrated circuit chip with at least one contact pad and an antenna with at least one corresponding end, the method including the steps of:

soldering a first end of a conductive wire on a contact pad of the chip;

soldering a second end of the conductive wire on a holding relay, said wire projecting with respect to an upper surface of the chip between the contact pad to which the first end is soldered and the holding relay to which the second end is soldered;

cutting off the conductive wire between the first and second ends of the conductive wire; and establishing a direct electric contact between the portion of the conductive wire that remains connected to the contact pad and the corresponding end of the antenna.

2. A method according to claim 1, wherein the projecting part of the conductive wire is applied on the corresponding end of the antenna during the step of establishing electrical contact between the wire and the antenna.

3. A method according to claim 1, wherein the steps of soldering the first and second ends of the conductive wire are done while the chip is still a part of a semiconductor wafer from which chips are subsequently diced by sawing.

4. A method according to claim 3, wherein the holding relay is a conductive pad of an adjacent chip on the wafer.

5. A method according to claim 3, wherein the holding relay is an intermediate pad in a dicing path between two adjacent chips on the wafer.

6. A method according to claim 3, wherein the projecting part of the conductive wire is cut off during a sawing operation in which the wafer is diced into elementary chips, thus forming in the projecting part of the conductive wire at least one free end projecting above the chip and opposed to the first or second end of the conductive wire.

7. A method according to claim 6, wherein at least one free end of the projecting part of the conductive wire is cut off just above the corresponding contact pad, thus forming a ball projecting above the upper surface of the chip.

8. A method according to claim 1 wherein the holding relay is a further contact pad on the upper surface of the same chip.

9. A method according to claim 1, further including the steps of gluing the chip provided with a conductive wire on a plastic sheet and gluing a coiled wire antenna on said sheet, with at least one end of the antenna being applied against the conductive wire soldered to the chip.

10. A method according to claim 1, further including the step of gluing the chip provided with a conductive wire on a plastic sheet carrying a printed antenna conductor, such that the conductive wire soldered to the chip is applied against one end of the antenna conductor.

* * * * *